(12) United States Patent  
Grzelka et al.

(10) Patent No.: US 9,325,987 B2
(45) Date of Patent: Apr. 26, 2016

(54) METHOD FOR MONITORING A SIGNAL

(71) Applicant: ADVANCED DIGITAL BROADCAST S.A., Chambesy (CH)

(72) Inventors: Piotr Grzelka, Zielona Gora (PL); Krzysztof Goraczkowski, Zielona Gora (PL); Adam Macugowski, Zielona Gora (PL)

(73) Assignee: ADVANCED DIGITAL BROADCAST S.A., Chambesy (CH)

( * ) Notice: Subject to any disclaimer, the term of this patent is extended or adjusted under 35 U.S.C. 154(b) by 0 days.

(21) Appl. No.: 14/628,305

(22) Filed: Feb. 23, 2015

(65) Prior Publication Data

US 2015/0326853 A1  Nov. 12, 2015

(30) Foreign Application Priority Data

May 8, 2014  (EP) .................................. 14167486

(51) Int. Cl.
| | |
|---|---|
| H04N 5/21 | (2006.01) |
| H04N 7/18 | (2006.01) |
| H04N 17/00 | (2006.01) |
| H04L 1/20 | (2006.01) |
| H04L 12/26 | (2006.01) |
| G01R 23/16 | (2006.01) |
| H04N 21/234 | (2011.01) |
| H04N 21/44 | (2011.01) |

(52) U.S. Cl.
CPC .............. *H04N 17/004* (2013.01); *G01R 23/16* (2013.01); *H04L 1/20* (2013.01); *H04L 43/0829* (2013.01); *H04N 17/00* (2013.01); *H04N 21/23418* (2013.01); *H04N 21/44008* (2013.01)

(58) Field of Classification Search
CPC .... H04N 19/154; H04N 19/159; H04N 17/00
USPC ................ 348/180, 192, 193, 181, 185, 607; 375/240.27, 229; 455/67.13, 115.1, 455/423; 382/275
See application file for complete search history.

(56) References Cited

U.S. PATENT DOCUMENTS

| | | | | |
|---|---|---|---|---|
| 5,966,186 A | * | 10/1999 | Shigihara ............. | H04N 5/4401 348/193 |
| 2013/0034141 A1 | * | 2/2013 | Massey .................. | H04L 27/38 375/228 |

* cited by examiner

Primary Examiner — Jefferey Harold
Assistant Examiner — Jean W Desir
(74) Attorney, Agent, or Firm — Mark M. Friedman

(57) ABSTRACT

A device for monitoring a signal, comprising: a combiner (103, 303) configured to combine the received signal to be monitored with an impairment signal; a signal spectrum analyzer (105, 305) configured to analyze spectrum of a signal output from the combiner (103, 303) upon receiving a trigger signal; a signal quality analyzer (108, 308) configured to analyze the signal output from the combiner and output a signal quality factor; a trigger generator (110, 310) configured to monitor the signal quality factor and output the trigger signal upon detecting the signal quality factor below a trigger threshold level; and an impairment simulator (112, 312) configured to generate the impairment signal and an impairment scaler (113, 313) configured to scale the impairment signal and input the scaled impairment signal to the combiner (103, 303).

11 Claims, 3 Drawing Sheets

METHOD FOR MONITORING A SIGNAL

DESCRIPTION

The present invention relates to signal monitoring, in particular monitoring signal in a television network.

A television network, such as a cable television network, is subject to many sources of noise and signal disruptions. By monitoring the signal in the network, sources of the noise can be identified and appropriate steps can be taken.

There are known signal spectrum analyzers that analyze the signal in the network continuously in a real-time manner. These analyzers typically monitor the physical signal quality and when the quality deteriorates, an event is triggered, and a "snapshot" of the signal is stored for future analysis. The is snapshot of the signal may comprise a copy of the received signal before, during and/or after the deterioration occurred or a summary of the physical parameters of the signal at that time. The snapshot may be analyzed later by network maintenance personnel to infer about possible source of errors. However, the physical signal quality analyzers are not able to detect all signal errors in the network.

It would be desirable to further improve signal monitoring devices and methods to detect a wider range of signal errors, in particular in a television network.

The object of the invention is a device for monitoring a signal, comprising a combiner configured to combine the received signal to be monitored with an impairment signal; a signal spectrum analyzer configured to analyze spectrum of a signal output from the combiner upon receiving a trigger signal; a signal quality analyzer configured to analyze the signal output from the combiner and output a signal quality factor; a trigger generator configured to monitor the signal quality factor and output the trigger signal upon detecting the signal quality factor below a trigger threshold level; and an impairment simulator configured to generate the impairment signal and an impairment scaler configured to scale the impairment signal and input the scaled impairment signal to the combiner.

Preferably, the signal output from the combiner is stored in memory.

Preferably, the device further comprises a front-end block for converting the input analog signal to a digital signal and a digital signal processing block for converting the digital signal to a complex baseband signal which is the received signal to be monitored.

Preferably, the signal quality analyzer is configured to monitor a signal quality factor selected from the group comprising: number of uncorrectable packets, signal power level, bit error rate, number of corrected packets, frequency error, I/Q gain imbalance, I/Q phase imbalance, modulation error ratio.

Preferably, the impairment simulator is configured to generate an impairment signal comprising adaptive white Gaussian noise, Rayleigh fading and/or Rician fading signal.

Preferably, the impairment scaler is configured to increase the impairment signal level when the signal quality factor is lower than the threshold level.

Preferably, the device further comprises a user display module configured to display signal spectrum calculated by the signal spectrum analyzer upon receipt of a trigger signal.

Preferably, the device further comprises a snapshot memory configured to store signal stored in memory and/or signal spectrum calculated by the signal spectrum analyzer upon receipt of a trigger signal.

Another object of the invention is a method for monitoring a signal, comprising the steps of: receiving a signal to be monitored; monitoring a signal quality factor to determine at least one signal quality factor; when the signal quality factor indicates a signal of a quality better than a signal quality threshold level, combining the received signal to be monitored with an impairment signal and increasing the level of the impairment signal; when the signal quality factor indicates a signal of a quality worse than a trigger threshold level, performing signal spectrum analysis of the received signal.

Preferably, the signal quality factor compared with the signal quality threshold level is the same as the signal quality factor compared with the trigger threshold level.

Preferably, the signal quality factor compared with the signal quality threshold level is different than the signal quality factor compared with the trigger threshold level.

The object of the invention is shown by means of exemplary embodiment on a drawing, in which.

Figure 1:
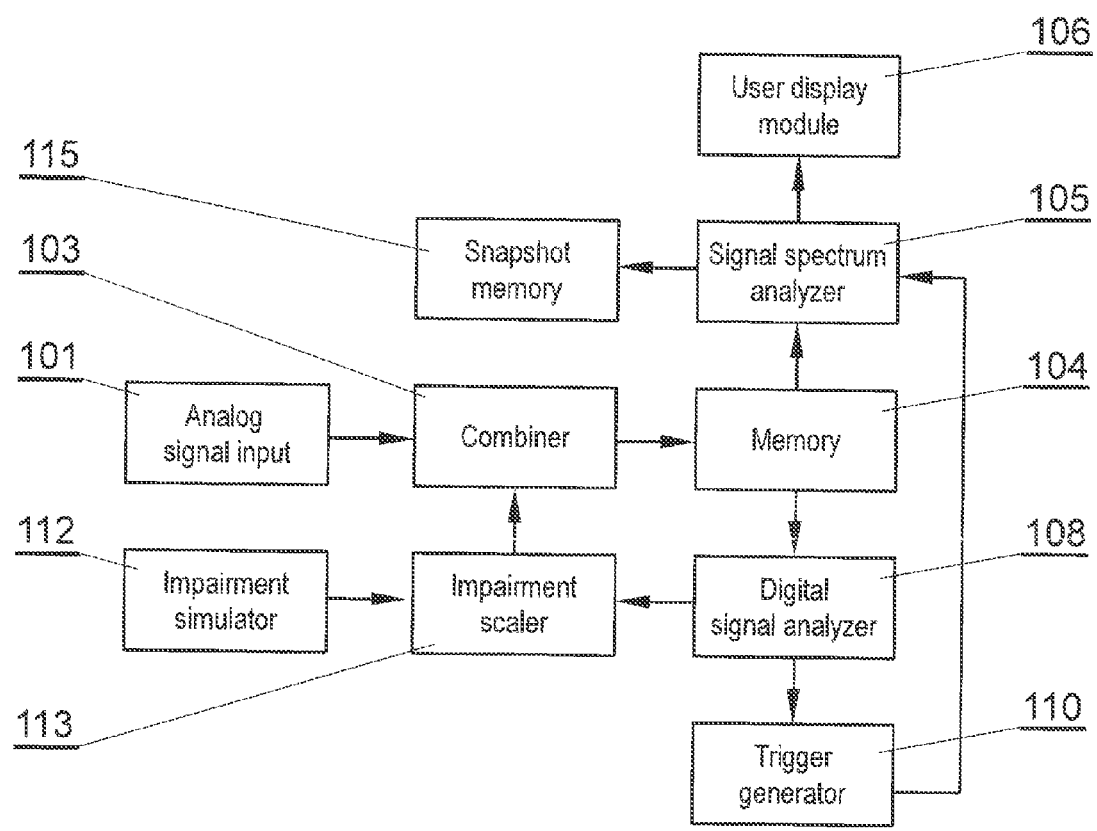
FIG. 1 shows a general structure of the device for monitoring a signal.

FIG. 1 shows a general structure of the device for monitoring a signal. The device comprises an analogue signal input block 101 for receiving an input signal and converting it to a digital signal. The digital input signal is combined with an impairment signal in a combiner 103 and the modified signal is stored in signal memory 104, from which it can be input to a signal spectrum analyzer 105 triggered by a trigger signal. The signal spectrum analyzer 105 receives a portion of signal stored in memory or parameters of that signal upon receiving a trigger signal indicative of problems with signal quality. It can store the signal or its parameters corresponding to the moment at which the trigger was generated, or a portion of signal or its parameters corresponding to a predetermined time before and after the trigger was generated. The signal from memory 104 (or directly from the combiner 103) is continuously analyzed by a digital signal analyzer 108 configured to provide digital signal quality factors, which are then monitored by a trigger generator. When signal quality factor indicates a signal of a quality worse than a predefined threshold, then a trigger signal is generated and input to the snapshot analyzer block 106. An impairment simulator 112 is configured to generate an impairment signal which, after scaling in an impairment scaler 113, is added in the combiner 103 to the received digital signal.

Figure 2:
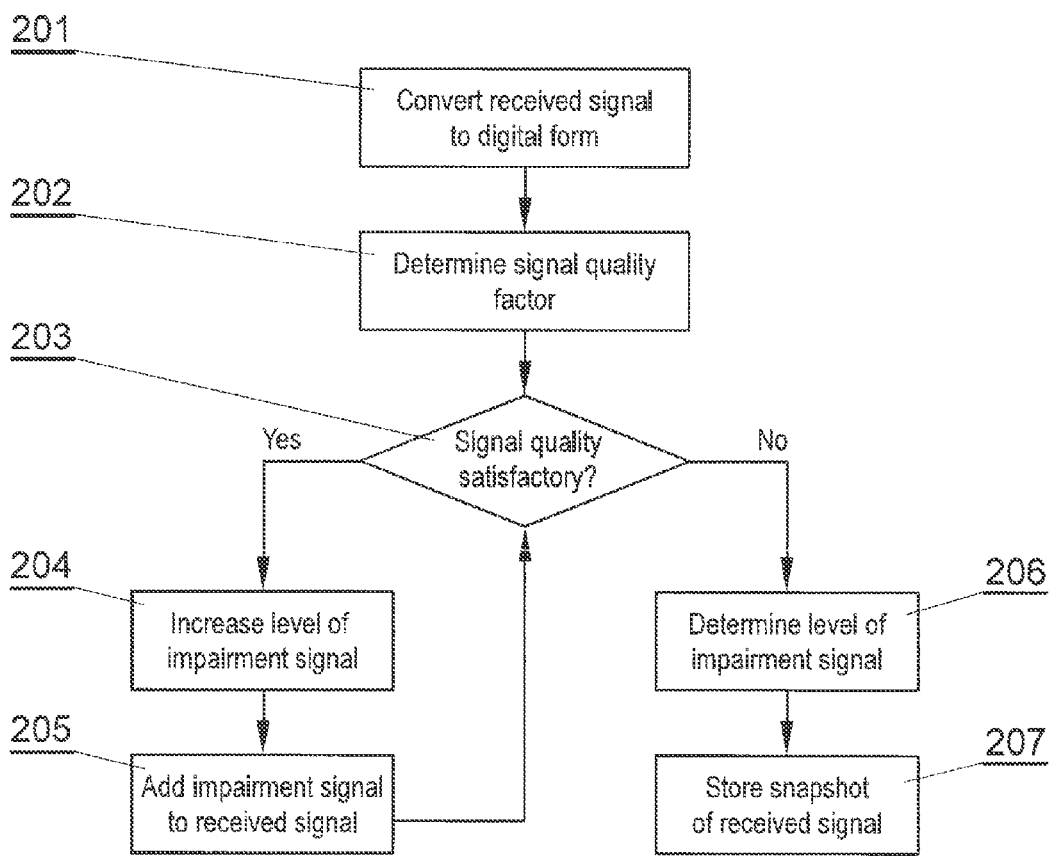
FIG. 2 shows steps of the method according to the invention.

The device operates according to the method of FIG. 2. In step 201 the input signal is converted to a digital form. A signal quality factor (such as BER or MER) to be monitored is selected in step 202—optionally, a plurality of signal quality factors may be monitored simultaneously. It is then checked in step 203 whether the measured signal quality is satisfactory. This can be done by analyzing a particular one or more signal quality factors. If the signal is satisfactory, the level of impairment signal generated by impairment simulator 112 is increased in the impairment scaler 113 in step 204, such that a higher level impairment signal is added to the received signal in the combiner 103 in step 205. This is carried out until the signal quality factor drops below a satisfactory level. Then, in step 206 the level of impairment signal is determined, and a trigger signal is generated to store a snapshot of the received signal in step 207 in the snapshot analyzer 107.

After a snapshot is taken, the procedure may stop and be resumed after a predetermined period. For example, the procedure can be executed in predetermined time periods, e.g. every 1 minute, 5 minutes, 15 minutes, 1 hour, 1 day etc. The procedure can be also executed on demand upon receiving a request from a remote controller. The procedure can be also executed upon detecting an external event, such as detection of signal quality deterioration from another sensor, such as a physical signal quality sensor.

Figure 3:
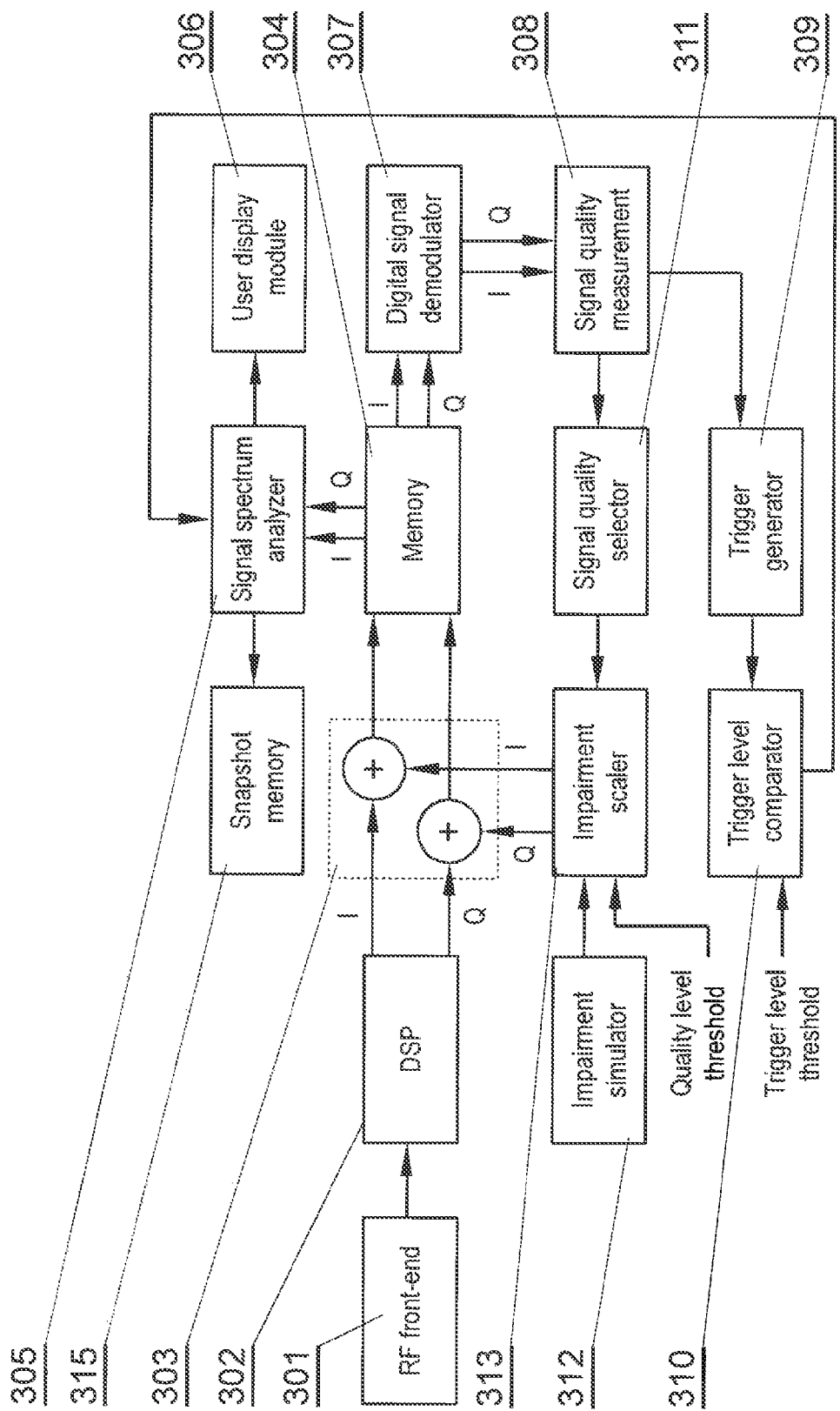
FIG. 3 shows a particular embodiment for monitoring a signal in a television network.

FIG. 3 shows a device for monitoring a signal in a cable network. The device comprises radio frequency (RF) front-end block 301 for receiving an input RF signal, such as a television signal of a terrestrial television network (e.g. according to DVB-T or DVB-T2 specification), a cable television network (e.g. according to DVB-C, DVB-C2 or DOCSIS specification), a satellite television network (e.g. according to DVB-S or DVB S2 specification) or an in-home network (e.g. according to MOCA specification). The RF front-end comprises signal filters, amplifiers, attenuators and frequency converters. The received signal is input to a digital signal processing (DSP) block 302, comprising digital filters, down-converters and decimators filters, which outputs a complex baseband signal, such as QAM signal, comprising in-phase (I) and quadrature (Q) components. The I and Q components of the baseband signal are then input to a channel impairment adder 303, which adds an impairment signal. The modified signals are then input to a memory block 304. The memory block 304 may be configured to continuously acquire a signal or predefined time length of for example 1 second. The signal from the memory block 304 is read by a spectrum analyzer module, for example complex FFT calculation module, which outputs amplitude spectrum data to a user display module 306. The user display module 306 may be a display screen for presenting the amplitude spectrum to the operator of the device, or it can be an output display interface for presenting the results to an external display screen, not forming part of the device. The data may be also stored in external memory 315, if the device is is configured to analyze signal quality over a long period and present aggregate results later. The signal from the memory block 304 is also read by a digital signal demodulator 307, which outputs a recovered complex signal to a signal quality measurement block 308. The signal quality measurement block 308 is configured to detect at least one factor descriptive of signal quality, such as the number of uncorrectable packets, signal power level, bit error rate (BER), number of corrected packets, frequency error, I/Q gain imbalance, I/Q phase imbalance, modulation error ratio (MER). Preferably, the signal quality measurement block 308 is configured to determine a plurality of signal quality factors at the same time, which are then input to signal quality selector 311 and to trigger source selector 309. The trigger source selector 309 is configured to select a particular signal quality factor (for example, BER) which will be input to a trigger level comparator 310 and compared with a trigger level threshold to generate a trigger signal. In case the selected signal quality factor is worse than the trigger level threshold, the trigger signal is generated by the comparator 310, which triggers the spectrum analyzer module 305 to acquire data from the memory block and generate a snapshot of the signal spectrum to be stored in external memory or displayed in the user display module. The signal quality selector 311 is configured to select a particular signal quality factor, which can be the same as the factor selected by the trigger source selector 309 (e.g. BER) or a different factor (e.g. number of corrected packets), which will be input to a channel impairment scaling block 313. The channel impairment scaling block receives a channel impairment signal from a impairment signal simulator 312, which generates a noise, such as adaptive white Gaussian noise, Rayleigh fading and/or Rician fading signal. The strength of the impairment signal which is combined with the received signal is dependent on predefined quality level threshold.

The devices and method presented above allow to detect quality problems in received signals. By generating additional signal noise represented by the impairment signal, problems in the signal can be more easily detected.

While the invention presented herein has been depicted, described, and has been defined with reference to particular preferred embodiments, such references and examples of implementation in the foregoing specification do not imply any limitation on the invention. It will, however, be evident that various modifications and changes may be made thereto without departing from the broader scope of the technical concept. The presented preferred embodiments are exemplary only, and are not exhaustive of the scope of the technical concept presented herein. Accordingly, the scope of protection is not limited to the preferred embodiments described in the specification, but is only limited by the claims that follow.

In addition, any combination of the appended claims in envisaged in the present application.

The invention claimed is:

1. A device for monitoring a signal, comprising: a combiner (103, 303) configured to combine the received signal to be monitored with an impairment signal; a signal spectrum analyzer (105, 305) configured to analyze spectrum of a signal output from the combiner (103, 303) upon receiving a trigger signal; a signal quality analyzer (108, 308) configured to analyze the signal output from the combiner and output a signal quality factor; a trigger generator (110, 310) configured to monitor the signal quality factor and output the trigger signal upon detecting the signal quality factor below a trigger threshold level; and an impairment simulator (1 12, 312) configured to generate the impairment signal and an impairment scaler (113, 313) configured to scale the impairment signal and input the scaled impairment signal to the combiner (103,303).

2. The device according to claim 1, wherein the signal output from the combiner (103, 303) is stored in memory (104, 304).

3. The device according to claim 1, comprising a front-end block (301) for converting the input analog signal to a digital signal and a digital signal processing block (302) for converting the digital signal to a complex baseband signal which is the received signal to he monitored.

4. The device according to claim 1, wherein the signal quality analyzer (308) is configured to monitor a signal quality factor selected from the group comprising: number of uncorrectable packets, signal power level, hit error rate (BER), number of corrected packets, frequency error, I/Q gain imbalance, I/Q phase imbalance, modulation error ratio (MER).

5. The device according to claim 1, wherein the impairment simulator (312) is configured to generate an impairment signal comprising adaptive white Gaussian noise, Rayleigh fading and/or Rician fading signal.

6. The device according to claim 1, wherein the impairment scaler (113, 313) is configured to increase the impairment signal level when the signal quality factor is lower than the threshold level.

7. The device according to claim. 1, further comprising a user display module (106, 306) configured to display signal spectrum calculated by the signal spectrum analyzer upon receipt of a trigger signal.

8. The device according to claim 1, further comprising a snapshot memory (115, 315) configured to store signal stored in memory (104, 304) and/or signal spectrum calculated by the signal spectrum analyzer upon receipt of a trigger.

9. A method for monitoring a signal, comprising the steps of: receiving a signal to he monitored (201); monitoring a signal quality factor (203) to determine at least one signal quality factor, when the signal quality factor indicates a signal of a quality better than a signal quality threshold level, combining (205) the received signal to be monitored with an impairment signal and increasing (204) the level of the impairment signal, and when the signal quality factor indicates a signal of a quality worse than a trigger threshold level, performing signal spectrum analysis (207) of the received signal.

10. The method according to claim 9, wherein the signal quality factor compared with the signal quality threshold level is the same as the signal quality factor compared with the trigger threshold level.

11. The method according to claim 9, wherein the signal quality factor compared with the signal quality threshold level is different than the signal quality factor compared with the trigger threshold level.

* * * * *

UNITED STATES PATENT AND TRADEMARK OFFICE
CERTIFICATE OF CORRECTION

PATENT NO. : 9,325,987 B2  
APPLICATION NO. : 14/628305  
DATED : April 26, 2016  
INVENTOR(S) : Piotr Grzelka et al.

Page 1 of 1

It is certified that error appears in the above-identified patent and that said Letters Patent is hereby corrected as shown below:

In the Claims

Column 4:

Claim 4, line 48 should be corrected as follows:
Change:
-- hit error rate --
to
"bit error rate"

Column 5:

Claim 9, line 2 should be corrected as follows:
Change:
-- to he monitored --
to
"to be monitored"

Signed and Sealed this  
Second Day of August, 2016

Michelle K. Lee  
*Director of the United States Patent and Trademark Office*